(12) United States Patent
Bang et al.

(10) Patent No.: US 7,671,361 B2
(45) Date of Patent: Mar. 2, 2010

(54) SEMICONDUCTOR DEVICE INCLUDING FUSE FOCUS DETECTOR, FABRICATING METHOD THEREOF AND LASER REPAIR METHOD USING THE FUSE FOCUS DETECTOR

(75) Inventors: Kwang-kyu Bang, Hwaseong-si (KR); Yong-won Lee, Incheon Metropolitan (KR); Kyeong-seon Shin, Yongin-si (KR); Hyen-wook Ju, Hwaseong-si (KR); Jeong-kyu Kim, Hwaseong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 45 days.

(21) Appl. No.: 11/434,144

(22) Filed: May 16, 2006

(65) Prior Publication Data
US 2007/0126084 A1    Jun. 7, 2007

(30) Foreign Application Priority Data
Dec. 1, 2005    (KR) ..................... 10-2005-0116641

(51) Int. Cl.
*H01L 23/58* (2006.01)
(52) U.S. Cl. .................. 257/48; 257/60; 257/508; 257/529; 438/128; 438/458; 438/598
(58) Field of Classification Search ............... None
See application file for complete search history.

(56) References Cited

U.S. PATENT DOCUMENTS 6,084,304 A *  7/2000  Huang et al. ............. 257/762
6,372,554 B1 *  4/2002  Kawakita et al. .......... 438/132
7,057,296 B2 *  6/2006  Hung et al. ............... 257/786
2004/0140501 A1 *  7/2004  Kim ......................... 257/328
2004/0150070 A1 *  8/2004  Okada et al. .............. 257/508

FOREIGN PATENT DOCUMENTS

| JP | 2002-368090 | 12/2002 |
| JP | 2003-163268 | 6/2003 |
| KR | 1020030037065 A | 5/2003 |

* cited by examiner

*Primary Examiner*—Minh-Loan T Tran
*Assistant Examiner*—Fei Fei Yeung Lopez
(74) *Attorney, Agent, or Firm*—Harness, Dickey & Pierce, P.L.C.

(57) ABSTRACT

Provided are a semiconductor device including a fuse focus detector, a fabrication method thereof and a laser repair method. In a chip region, fuses may be formed at a first level. A fuse focus detector including first and second conductive layers may be formed in a scribe line region. The first conductive layer may be formed at the first level, while the second conductive layer may be formed at a different level. For a laser repair method, a target region may be divided into sub-regions. In one selected sub-region, the fuse focus detector may be laser scanned in a direction for a reflection light measurement providing information on a thickness of the fuse focus detector. Using the thickness information, a focus offset value of a fuse in the selected sub-region may be calculated. When the focus offset value is within an allowable range, fuse cutting may be performed.

13 Claims, 9 Drawing Sheets

SEMICONDUCTOR DEVICE INCLUDING FUSE FOCUS DETECTOR, FABRICATING METHOD THEREOF AND LASER REPAIR METHOD USING THE FUSE FOCUS DETECTOR

PRIORITY STATEMENT

This application claims the benefit of priority to Korean Patent Application No. 10-2005-0116641, filed on Dec. 1, 2005, in the Korean Intellectual Property Office, the entire contents of which are incorporated herein by reference.

BACKGROUND OF THE INVENTION

1. Field of the Invention

Example embodiments of the present invention relate to a semiconductor device including a fuse coupled with a redundancy circuit, a fabrication method thereof and a laser repair method for a semiconductor device using fuse cutting. More particularly, example embodiments of the present invention relate to a semiconductor device including a fuse focus detector for determining a focus offset value of a laser beam used for laser cutting, a semiconductor device fabrication method and a laser repair method using the fuse focus detector.

2. Description of the Related Art

As semiconductor devices are becoming highly integrated and a capacitance level thereof is also being increased, memory cells are more likely to have defects resulting from the fabrication of the semiconductor devices. As a result, a product yield of a semiconductor device may be reduced. One representative attempt to overcome the reduction in the product yield is to use a redundancy circuit to replace a defective main cell of a semiconductor memory device. Generally, a redundancy circuit replaces a defective main cell by cutting a corresponding fuse within a fuse box formed in a peripheral region of a semiconductor memory device. The fuse may be cut during the performance of a laser repair method. The laser repair method may include selectively cutting a fuse within a fuse box based on test results from a test performed on the semiconductor device.

During a laser repair method for replacing a defective cell with a normal redundancy circuit, a laser beam having a certain spot size may be used for fuse cutting. As the integration scale of semiconductor devices has become highly advanced, a fuse size and a pitch between the fuses have also become smaller. When such micronized fuses are cut, the spot size of a laser beam used for the fuse cutting and the thickness of a fuse may be important factors. However, when an etching process is performed to open the fuses during a method of fabricating a semiconductor device, the fuses may be exposed and may have varying thickness from the top. The thickness of each of the fuses may be different from each other depending on a position of the fuses on a wafer. Therefore, it may be difficult to control the uniformity of the final thicknesses of the fuses in different regions of the wafer.

Because of a variation in fuse thickness, which may depend on a position on a wafer, a focus offset value indicating a distance between a focused point and a lens through which a laser beam is emitted should be varied depending on a position on a wafer. However, in conventional fuse cutting methods and technology, a consistent focus offset value is applied regardless of the position on the wafer. As a result, fuses adjacent to a target fuse to be cut may be damaged and/or the target fuse may not be cut. Also, because a difference between focus offset values of a central region and an edge region may be large, a number of chips on a wafer may be severely affected and/or become defective.

SUMMARY OF THE INVENTION

An example embodiment of the present invention provides a semiconductor device. The semiconductor device may include a fuse focus detector which may be used to determine an appropriate focus offset value for a laser beam depending on a position on a wafer and considering a variation in the thickness of fuses depending on a position of the fuses on the wafer.

An example embodiment of the present invention also provides a method of fabricating a semiconductor device. The method may perform a fuse cutting operation based on an appropriate focus offset value depending on a position on a wafer by forming a fuse focus detector through a relatively simple process without securing additional space in a chip region.

An example embodiment of the present invention also provides a laser repair method. The laser repair method may reduce a defect generation rate by determining an appropriate focus offset value of a laser beam with considering a variation in the thickness of fuses depending on a position of the fuses on a wafer.

An example embodiment of the present invention provides a semiconductor device. The semiconductor device may include a substrate, which may include a chip region, a scribe line region, a plurality of fuses and a fuse focus detector. The fuses may be formed at a first level with a first height from the substrate in the chip region. The fuse focus detector may be formed on the substrate and may include a first conductive layer formed at the first level with the first height and a second conductive layer formed at a second level with a different height from the first height.

According to an example embodiment of the present invention, the second conductive layer may be formed at the second level with a second height higher than the first height.

According to example embodiment of the present invention, when viewed from above, the first conductive layer may have a rectangular shape and the second conductive layer may have a rectangular frame shape surrounding the first conductive layer. Alternatively, the first conductive layer may have a linear shape and the second conductive layer may have a rectangular frame shape surrounding the first conductive layer. Still further, the first conductive layer and the second conductive layer may have linear shapes and may be arranged in parallel when viewed from above.

An example embodiment of the present invention provides a method of fabricating a semiconductor device. The method may include forming a fuse focus detector on a substrate. The forming of the fuse focus detector may include forming a first conductive layer at a first level with a first height from the substrate; and forming a second conductive layer adjacent to the first conductive layer at a second level with a second height higher than the first height.

An example embodiment of the present invention provides a method of fabricating a semiconductor device. In the method, a first conductive material may be formed at a first level with a first height from a substrate including a chip region and a scribe line region and patterned to form a plurality of fuses in the chip region and a first conductive layer for a fuse focus detector in the scribe line region. A first insulation layer may be formed on the fuses and the first conductive layer. A second conductive material may be formed on the first insulation layer and may be patterned to form a second conductive layer for the fuse focus detector in the scribe line region. A second insulation layer may be formed on the second conductive layer. Portions of the first insulation layer and the second insulation layer may be removed to expose the fuses and the first conductive layer.

According to an example embodiment of the present invention, a chip region may include a cell region and a peripheral region, and the fuses may be formed in the peripheral region of the chip region.

A method of fabricating a semiconductor device according to an example embodiment of the present invention may also include forming a first interconnection line layer for constructing a structure of multiple interconnection lines in a cell region. The first interconnection line layer may be formed in the cell region simultaneously with the fuses and the first conductive layer. The method may also include forming a second interconnection line layer on the first interconnection line layer to construct the structure of the multiple interconnection lines in the cell region. The second interconnection line layer may be formed simultaneously with the second conductive layer.

An example embodiment of the present invention provides a laser repair method for a semiconductor device. In the laser repair method, a laser repair target region of the semiconductor device may be divided into a plurality of sub-regions. A fuse focus detector may be laser scanned in a direction within one selected sub-region among the sub-regions to measure reflection light of a laser beam. Using the measured reflection light, information on a thickness of the fuse focus detector may be obtained. A thickness difference between the first conductive layer and the second conductive layer may be calculated based on the thickness information. A focus offset value of a fuse in the selected sub-region may be calculated based on the calculated thickness difference. A fuse cutting operation may be performed in the selected sub-region if the calculated focus offset value is within an allowable range.

According to an example embodiment of the present invention, the laser scanning of the fuse focus detector may be performed in a direction such that both of the first conductive layer and the second conductive layer of the fuse focus detector are laser scanned at the same time.

According to the example embodiments of the present invention, because the fuse focus detector may be formed in the scribe line region, securing additional space in the chip region of a highly integrated semiconductor device may not be necessary. Also, an additional process of forming the fuse focus detector may not be necessary. Even if the fuses formed at the same level on the wafer have different thickness depending on a position of the fuses on the wafer, an accurate focus offset value for the fuse to be cut may be calculated, and the fuse cutting may be performed if the calculated focus offset value is within an allowable range. Accordingly, a rate of generating defective semiconductor devices during the laser repair process may be reduced according to example embodiments of the present invention.

BRIEF DESCRIPTION OF THE DRAWINGS

The above and other features and advantages of the present invention will become more apparent by describing in detail example embodiments of the present invention with reference to the attached drawings in which.

DETAILED DESCRIPTION OF EXAMPLE EMBODIMENT OF THE PRESENT INVENTION

Figure 1:
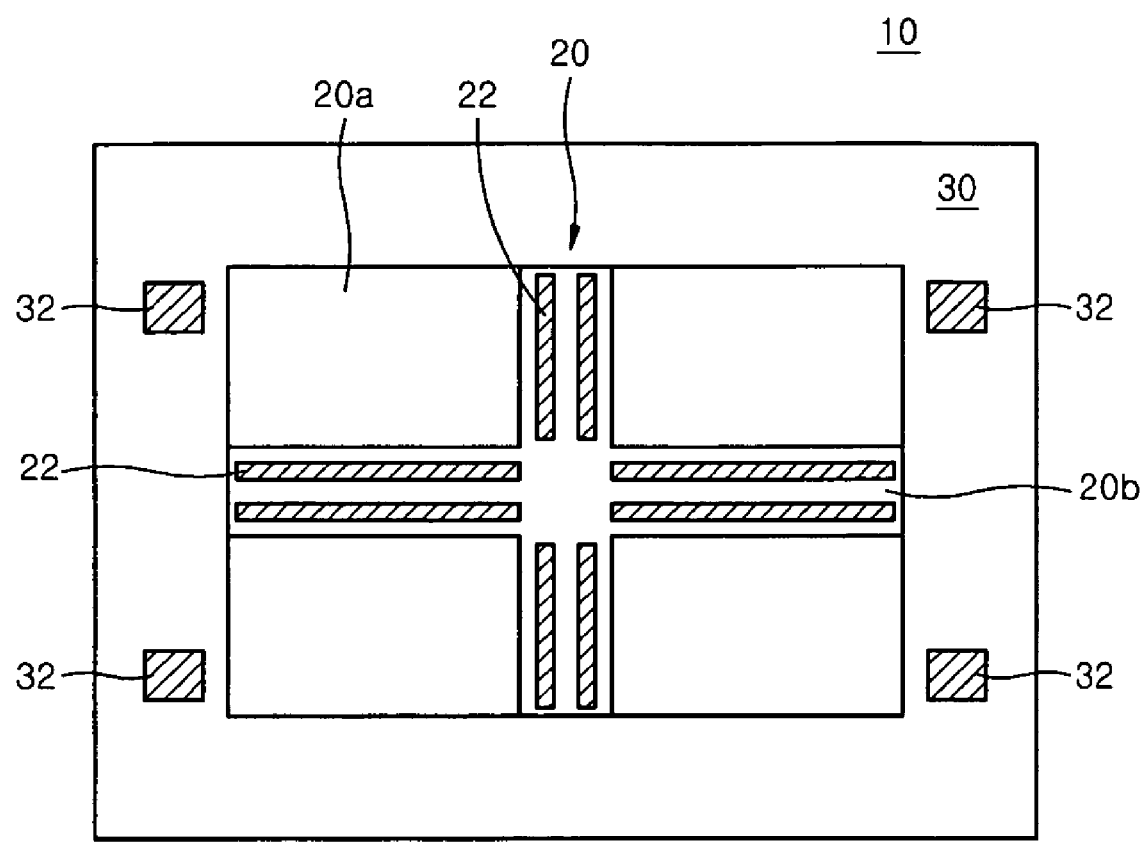
FIG. 1 is a diagram showing a layout of a semiconductor device according to an example embodiment of the present invention.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the present invention are capable of various modifications and alternative forms, embodiments of the present invention are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments of the present invention will now be described more fully with reference to the accompanying drawings, in which example embodiments of the invention are shown.

FIG. 1 is a diagram showing a layout of a semiconductor device 10 according to an example embodiment of the present invention.

FIG. 1 illustrates a chip region 20, which may be formed on a wafer to realize a dynamic random access memory (DRAM), and a scribe line region 30, which may be formed around the chip region 20.

The chip region 20 may include a cell region 20a and a peripheral region 20b. Memory cells corresponding to capacitance of a memory may be formed in the cell region 20a, whereas peripheral circuits for driving unit cells of the cell region 20a such as a decoder, for example, may be formed in the peripheral region 20b. For example, a buffer circuit, a redundancy circuit, and/or a fuse circuit unit 22 may be formed in the peripheral region 20b.

A fuse focus detector 32 may be formed in the scribe line region 30. One or more fuse focus detectors 32 may be formed around the chip region 20. For example, FIG. 1 illustrates four fuse focus detectors 32, each of which is formed in the scribe line region 30. The fuse focus detector 32 may be formed to determine an improved and/or optimum focus offset value for a laser beam depending on a position of the fuses on a wafer and considering the fact that the fuses formed in the fuse circuit unit 22 of the peripheral region 20b may have a different thickness depending on the position of the fuse on the wafer.

According to an example embodiment of the present invention, because the fuse focus detector 32 may be formed in the scribe line region 30, the fuse focus detector 32 may not effect the pattern density within the chip region 20, even if the pattern density increases in the cell region 20a and the peripheral region 20b due to a large-scale of integration. Therefore, the fuse focus detector 32 may be formed with an intended pattern size regardless of the pattern density within the chip region 20. For example, the pattern size of the fuse focus detector 32 may be large, for example, several tens of micrometers. Forming the fuse focus detector 32 without limiting the size, regardless of the pattern density in the chip region 20, may increase accuracy of a thickness measurement obtained using the fuse focus detector 32.

Figure 2A:
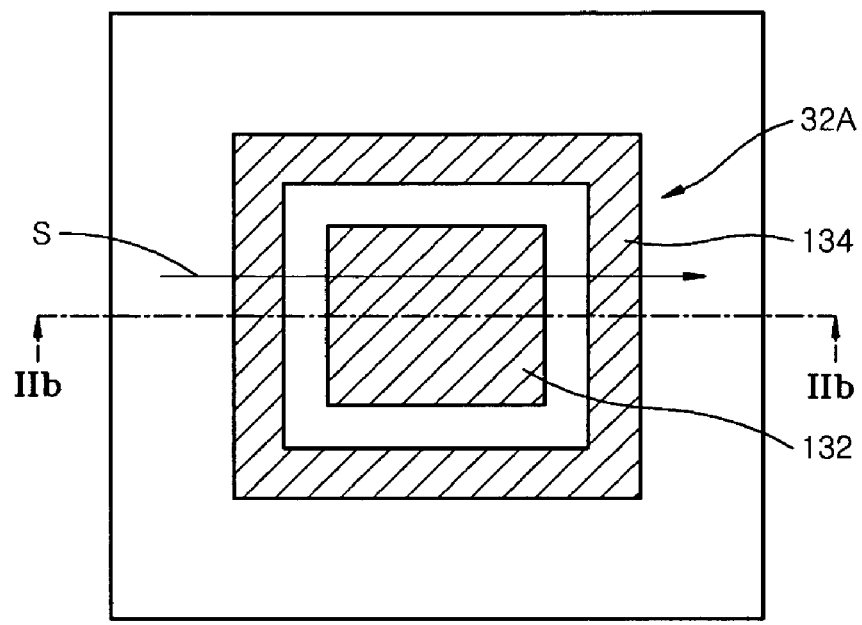
FIG. 2A is a view from above illustrating a main part of a fuse focus detector of a semiconductor device according to an example embodiment of the present invention.
Figure 2B:
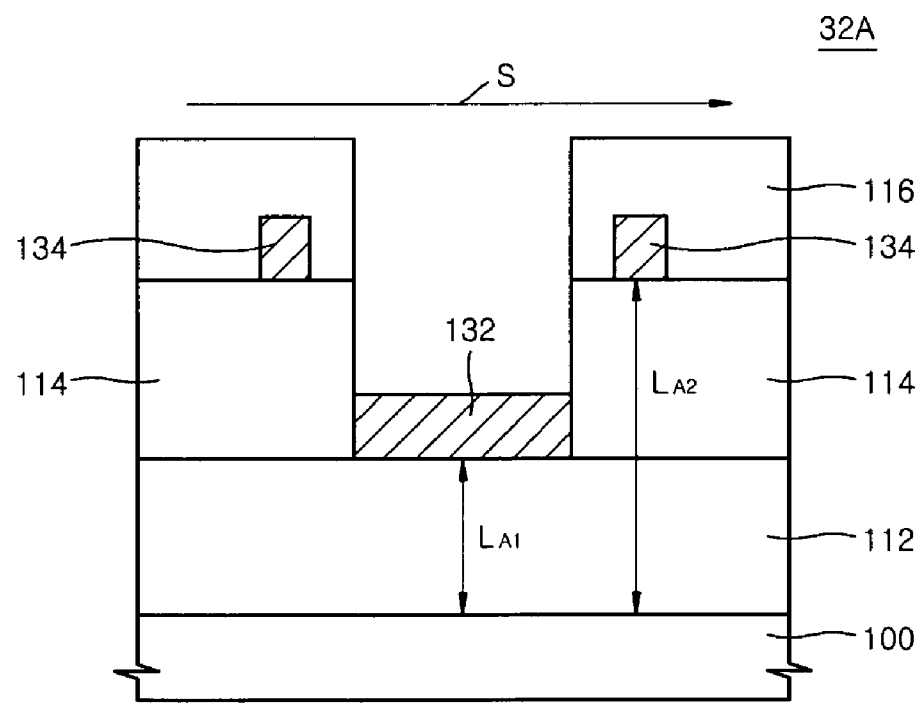
FIG. 2B is a cross-sectional view of the semiconductor device of FIG. 2A taken along line IIb-IIb'.

FIG. 2A is a view from above illustrating a main part of a fuse focus detector 32A according to an example embodiment of the present invention. The fuse focus detector 32A may be implemented as the fuse focus detector 32 illustrated in FIG. 1. FIG. 2B is a cross-sectional view of the main part of the example fuse focus detector 32A of FIG. 2A taken along the line IIb-IIb'.

With reference to FIGS. 2A and 2B, the fuse focus detector 32A may include a first conductive layer 132 and a second conductive layer 134. The first conductive layer 132 may be formed in the scribe line region 30 (refer to FIG. 1) of a substrate 100. The second conductive layer 134 may be formed in a portion of the scribe line region 30 of the substrate 100, adjacent to the first conductive layer 132, but at a different level from a level in which the first conductive layer 132 may be formed. For example, it is illustrated in FIGS. 2A and 2B that the second conductive layer 134 is formed at a higher level than the level at which the first conductive layer 132 is formed in the scribe line region 30 of the substrate 100. According to this example, a distance $L_{A2}$ from the substrate 100 to the second conductive layer 134 is larger than a distance $L_{A1}$ from the substrate 100 to the first conductive layer 132. When viewed from above, the first conductive layer 132 may be formed in a rectangular shape, while the second conductive layer 134 may be formed in a rectangular frame shape. The second conductive layer 134 may be formed to surround the first conductive layer 132. Reference numerals 112, 114, and 116 represent insulation layers according to an example embodiment of the present invention.

It should be noted that the present invention is not limited to the example embodiment of the present invention illustrated in FIGS. 2A and 2B, and it will be apparent to those skilled in the art that the first conductive layer 132 and the second conductive layer 134 may be formed in various shapes without departing from the scope of the present invention. The fuse focus detector shown in FIGS. 2A and 2B according to an example embodiment of the present invention may be modified in various forms differing from the configuration explained with reference to FIGS. 2A and 2B. For example, the first conductive layer 132 may be formed at a higher level than a level at which the second conductive layer 134 is formed.

Figure 3A:
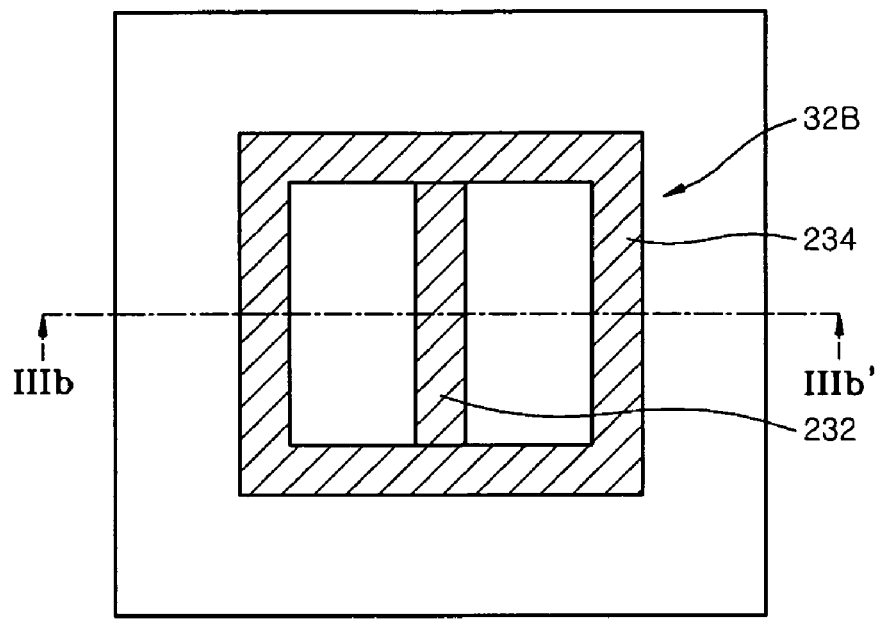
FIG. 3A is a view from above illustrating a main part of a fuse focus detector of a semiconductor device according to an example embodiment of the present invention.
Figure 3B:
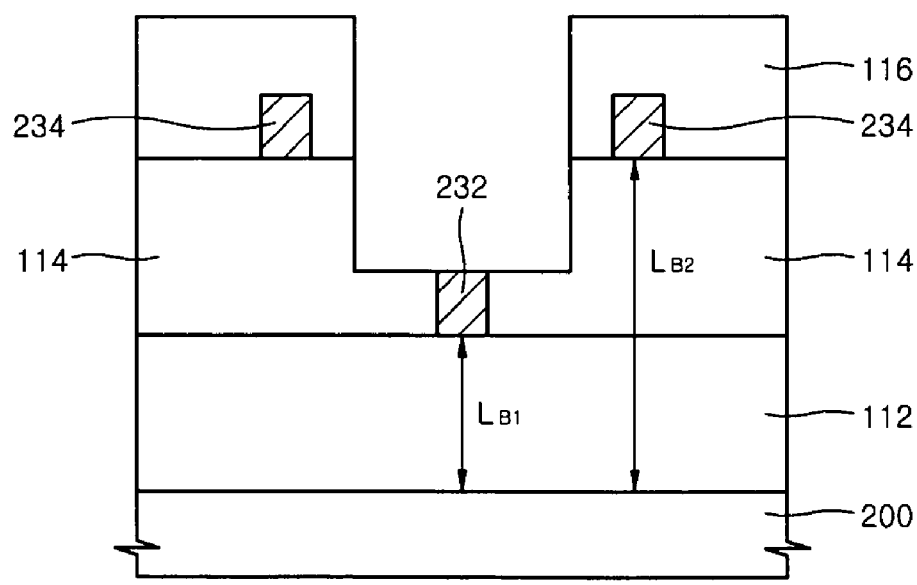
FIG. 3B is a cross-sectional view of the semiconductor device of FIG. 3A taken along line IIIb-IIIb'.

FIG. 3A is a view from above illustrating a main part of a fuse focus detector 32B according to an example embodiment of the present invention. The fuse focus detector 32B may be implemented as the fuse focus detectors 32 illustrated in FIG. 1 according to an example embodiment of the present invention. FIG. 3B is a cross-sectional view of the main part of the fuse focus detector 32B of FIG. 3A taken along the line IIIb-IIIb'. In FIGS. 3A and 3B, the same or like reference numerals are used for the same or like elements described in FIGS. 2A and 2B, and the detailed description of the same or like elements will be omitted herein for the sake of brevity.

Referring to FIGS. 3A and 3B, the fuse focus detector 32B may include a first conductive layer 232 and a second conductive layer 234. The first conductive layer 232 may be formed in the scribe line region 30 (refer to FIG. 1) of a substrate 200. The second conductive layer 234 may be formed in a portion of the scribe line region 30 of the substrate 200, adjacent to the first conductive layer 232, but at a different level from a level at which the first conductive layer 232 is formed. For example, it is illustrated in FIGS. 3A and 3B that the second conducive layer 234 is formed at a higher level than the level at which the first conductive layer 232 is formed in the scribe line region 30 of the substrate 200. According to this example, a distance $L_{B2}$ from the substrate 200 to the second conductive layer 234 is larger than a distance $L_{B1}$ from the substrate 200 to the first conductive layer 232. When viewed from above, the first conductive layer 232 may be formed in a linear shape, while the second conductive layer 234 may be formed in a rectangular frame shape. The second conductive layer 234 may be formed to surround the first conductive layer 232.

In the peripheral region 20b of the chip region 20, the first conductive layer 232 may be formed on the substrate 200 at substantially the same level at which a fuse is formed.

It should be noted that the configuration of the fuse focus detector is not limited to the example embodiment of the present invention illustrated in FIGS. 3A and 3B, and it will be apparent to those skilled in the art that the configuration of the fuse focus detector 32B may be modified without departing from the scope of the present invention. For example, the first conductive layer 232 may be formed at a higher level than a level at which the second conductive layer 234 is formed.

Figure 4A:
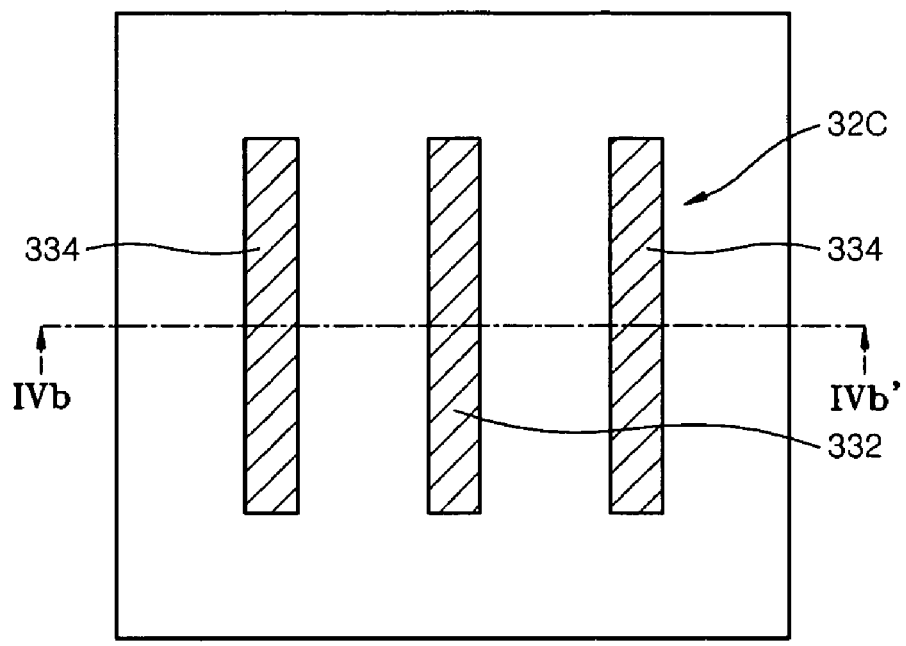
FIG. 4A is a view from above illustrating a main part of a fuse focus detector of a semiconductor device according to an example embodiment of the present invention.
Figure 4B:
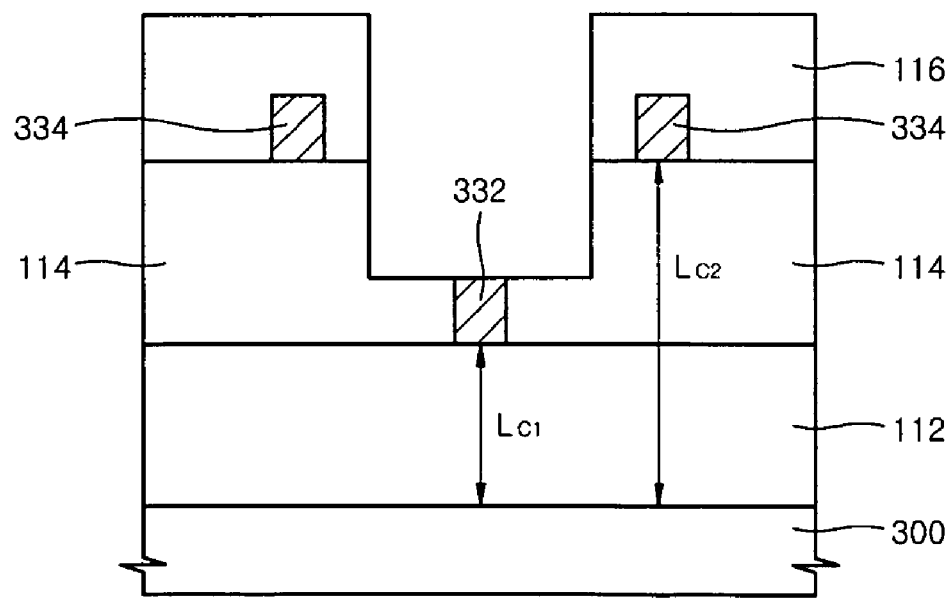
FIG. 4B is a cross-sectional view of the semiconductor device of FIG. 4A taken along the line IVb-IVb'.

FIG. 4A is a view from above illustrating a main part of a fuse focus detector 32C according to an example embodiment of the present invention. The fuse focus detector 32C may be implemented as the fuse focus detectors 32 illustrated in FIG. 1. FIG. 4B is a cross-sectional view of the main part of the fuse focus detector 32C of FIG. 4A taken along the line IVb-IVb'. In FIGS. 4A and 4B, the same or like reference numerals are used for the same or like elements described in FIGS. 2A and 2B, and detailed description of the same or like elements will be omitted herein for the sake of brevity.

Referring to FIGS. 4A and 4B, the fuse focus detector 32C may include a first conductive layer 332 and a second conductive layer 334. The first conductive layer 332 may be formed in the scribe line region 30 (refer to FIG. 1) of a substrate 300. The second conductive layer 334 may be formed in a portion of the scribe line region 30 of the substrate 300, adjacent to the first conductive layer 332, but at a different level from a level at which the first conductive layer 332 is formed. For example, it is illustrated in FIGS. 4A and 4B that the second conducive layer 334 is formed at a higher level than the level at which the first conductive layer 332 is formed in the scribe line region 30 of the substrate 300. According to this example, a distance $L_{c2}$ from the substrate 300 to the second conductive layer 334 is larger than a distance $L_{c1}$ from the substrate 300 to the first conductive layer 332. When viewed from above, the first conductive layer 332 and the second conductive layer 334 may be formed in a linear shape. For example, the linear shape of the first conductive layer 332 may be between the linear shapes of the second conductive layer 334.

In the peripheral region 20b of the chip region 20, the first conductive layer 332 may be formed on the substrate 300 at substantially the same level at which a fuse is formed.

It should be noted that the configuration of the fuse focus detector is not limited to the example embodiment of the present invention illustrated in FIGS. 4A and 4B, and it will be apparent to those skilled in the art that the configuration of the fuse focus detector 32C may be modified without departing from the scope of the present invention. For instance, the first conductive layer 332 may be formed at a higher level than a level in which the second conductive layer 334 is formed.

FIGS. 5A through 5G are cross-sectional views illustrating a method of fabricating a semiconductor device according to an example embodiment of the present invention.

Operations described herein may be performed at substantially the same time as operations of forming a structure of multiple interconnection lines in a cell region of a chip region of a substrate 500 according to an example embodiment of the present invention. While the multiple interconnection lines are formed, those conductive layers described herein may be formed using the same material used for the interconnection lines formed on the substrate 500 and may be at substantially the same level as the level at which a corresponding conductive layer is formed. FIGS. 5A through 5G illustrate a scribe line region, which may be allocated outside the chip region of the substrate 500, and a peripheral region, which may be inside the chip region. FIGS. 5A through 5G illustrate a method of forming a structure, which corresponds to the cross-sectional view taking along the line IIb-IIb' of FIG. 2A, in the scribe line region.

Figure 5A:
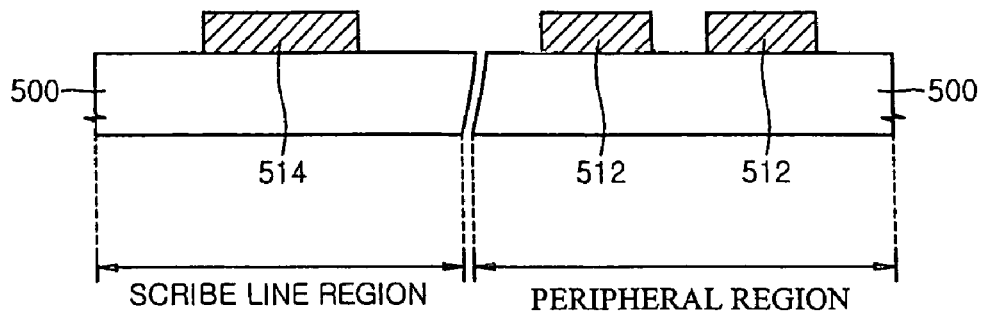
FIGS. 5A through 5G are cross-sectional views illustrating a method of fabricating a semiconductor device according to an example embodiment of the present invention.

Referring to FIG. 5A, the substrate 500, including the scribe line region 30 and the chip region 20 as illustrated in FIG. 1, may be prepared. Although not illustrated in FIGS. 5A through 5G, the chip region 20 may include a cell region 20a and a peripheral region 20b as illustrated in FIG. 1. Unit elements such as transistors and capacitors, for example, which may be necessary for configuring a semiconductor device, may be formed in the chip region 20 of the substrate 500. The unit elements may be arranged and overlaid with a planarized insulation layer in a cell region 20a of the chip region 20.

A first conductive material may be formed on the substrate 500 to a thickness of approximately 2,000 Å to approximately 3,000 Å. The first conductive material may then patterned to substantially simultaneously form a plurality of fuses 512 in the chip region and a first conductive layer 514 for a fuse focus detector in the scribe line region. As illustrated in FIG. 5A, the fuses 512 may be arranged in parallel in a horizontal direction. The first conductive material may be formed of a metal or a metal nitride. For example, the first conductive material may be formed of aluminum, copper or an alloy thereof. The first conductive layer 514 may further include layers of titanium (Ti)/titanium nitride (TiN), for example, which may be formed on the top and bottom surfaces of the first conductive layer 514.

During the formation of the fuses 512 and the first conductive layer 514, an interconnection line layer for forming a structure of multiple interconnection lines may be formed in the cell region of the substrate 500. The interconnection line layer formed in the cell region may be formed of the first conductive material, and the patterning for forming the interconnection line layer may be performed substantially simultaneously with the patterning for forming the fuses 512 and the first conductive layer 514.

Figure 5B:
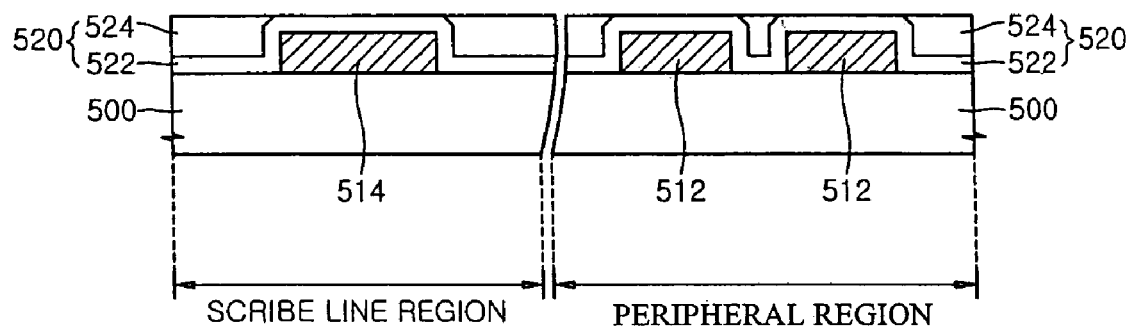

Referring to FIG. 5B, an insulation layer 520 may be formed on the resulting structure illustrated in FIG. 5A. The insulation layer 520 may separate the fuses 512 from each other in the chip region. The insulation layer 520 may include a first oxide layer 522 and a second oxide layer 524. The first oxide layer 522 may be formed of a plasma enhanced tetraethyl orthosilicate (P-TEOS), and the second oxide layer 524 may be formed of undoped silicate glass (USG), for example. Alternatively, the second oxide layer 524 may be formed of a densified flowable oxide (FOX), for example.

Figure 5C:
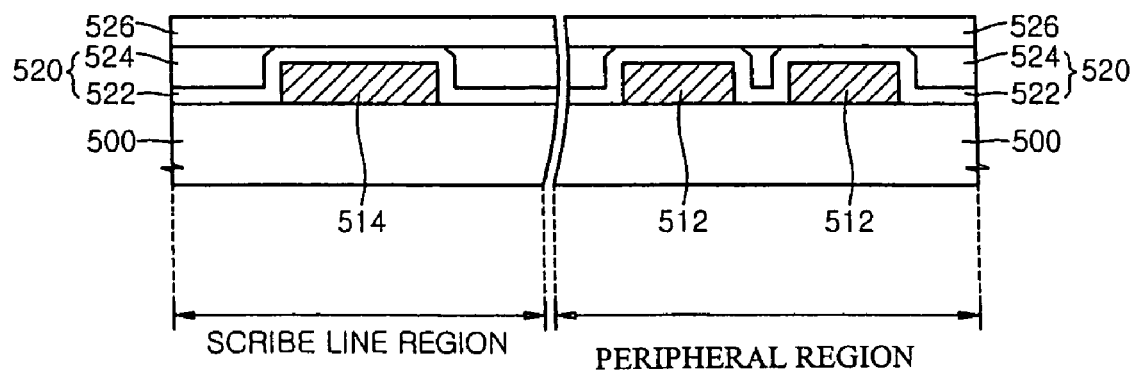

Referring to FIG. 5C, a planarized inter-layer insulation layer 526 may be formed on the insulation layer 520. The inter-layer insulation layer 526 may be formed of P-TEOS.

Figure 5D:
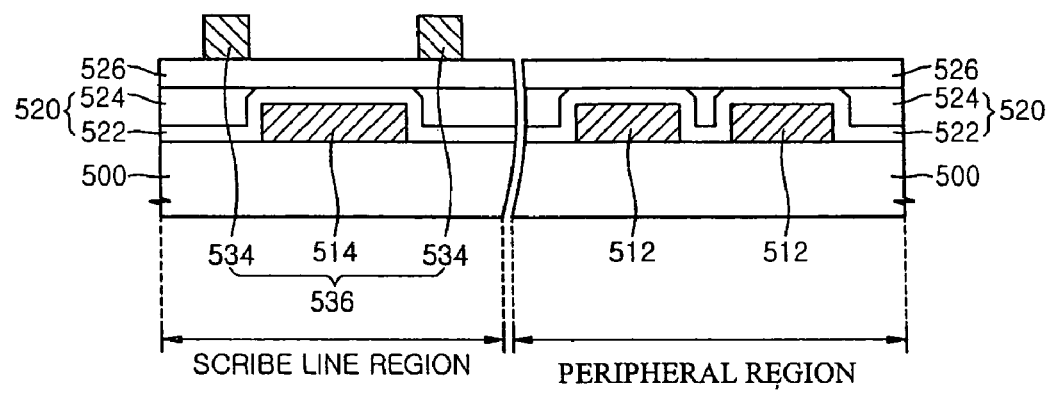

Referring to FIG. 5D, a second conductive material may be formed on the inter-layer insulation layer 526 to a thickness ranging from approximately 2,000 Å to approximately 3,000 Å. The second conductive material may then patterned to form second conductive layers 534 for the fuse focus detector in the scribe line region 30. The second conductive material may be formed of a metal or a metal nitride. For example, the second conductive material may be formed of aluminum, copper, or an alloy thereof. The second conductive layers may further include layers of Ti/TiN formed on the top and bottom surfaces of the second conductive layers 534 according to an example embodiment of the present invention.

During the formation of the second conductive layers 534, one interconnection line layer for forming a multiple interconnection line structure may be formed in the cell region 20a of the substrate 500. The interconnection line layer formed in the cell region 20a may be formed of the second conductive material, and the patterning for forming the interconnection line layer may be performed substantially simultaneously with the patterning for forming the second conductive layers 534.

The second conductive layers 534 and the first conductive layer 514 in the scribe line region may provide a fuse focus detector 536. The fuse focus detector 536 may have a structure corresponding to a structure of the fuse focus detector 32A illustrated in FIGS. 2A and 2B.

Figure 5E:
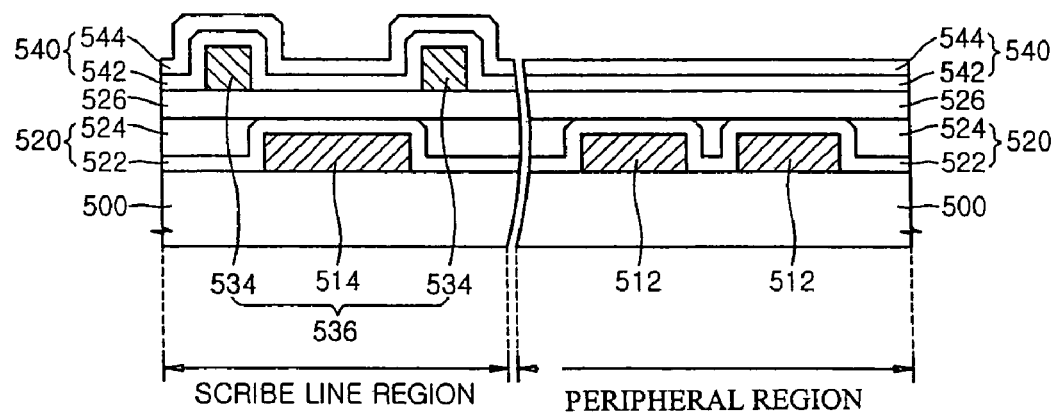

Referring to FIG. 5E, a passivation layer 540 may be formed on a resulting structure illustrated in FIG. 5D. The passivation layer 540 may include a third oxide layer 542 and a nitride layer 544 formed on the substrate 500. For example, the third oxide layer 542 and the nitride layer 544 may be formed in a sequential order. The third oxide layer 542 may be formed of P-TEOS, and the nitride layer may be formed of plasma-enhanced silicon nitride (P—SiN), for example.

Figure 5F:
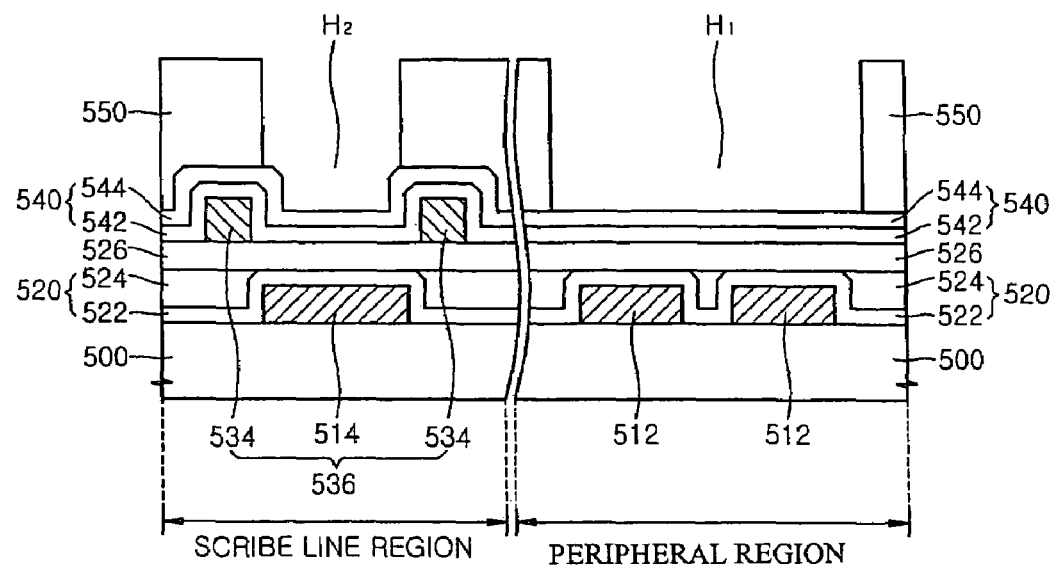

Referring to FIG. 5F, a photoresist pattern 550 may be formed on the passivation layer 540. The photoresist pattern 550 in the chip region may be formed to have a first opening $H_1$, which may be disposed above the fuses 512. The photoresist pattern 550 may also be formed to have a second opening $H_2$ in the scribe line region 30 and disposed above the first conductive layer 514.

Figure 5G:
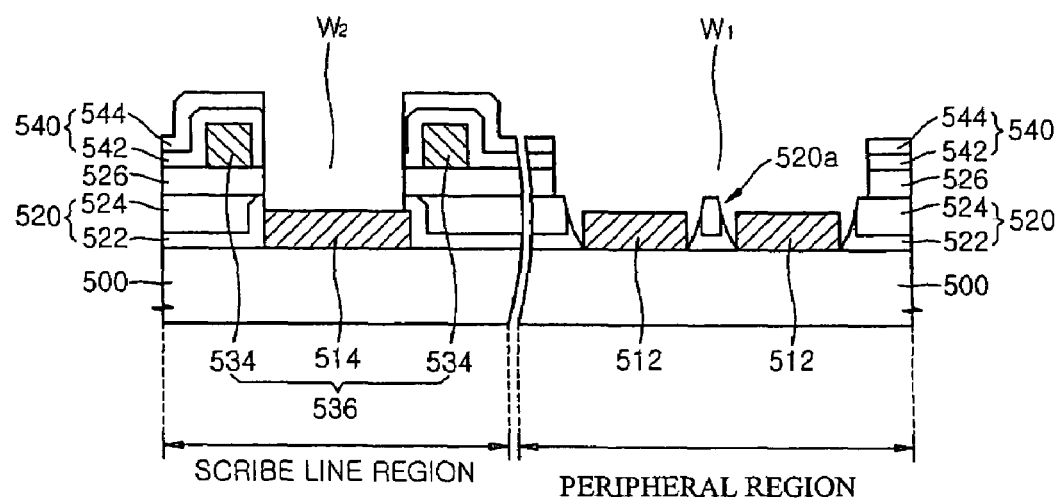

Referring to FIG. 5G, the passivation layer 540, the interlayer insulation layer 526, and the insulation layer 520 may be dry etched using the photoresist pattern 550 as an etch mask so that a first window $W_1$, exposing the fuses 512, and a second window $W_2$, exposing the first conductive layer 514, may be formed in the chip region and in the scribe line region 30, respectively. The first window $W_1$ and the second window $W_2$ may be formed substantially simultaneously. During the dry etching, an etch gas may be one selected from the group including $CF_4$, $CHF_3$, and $O_2$.

The photoresist pattern 550 remaining on the substrate 500 may be removed. As illustrated in FIG. 5G, a fuse separation pattern 520a may be formed between the fuses 512 and may be exposed through the first window $W_1$. The fuse separation pattern 520a may be formed from the insulation layer 520. The first conductive layer 514 may be exposed through the second window $W_2$ in the scribe line region 30.

Figure 6:
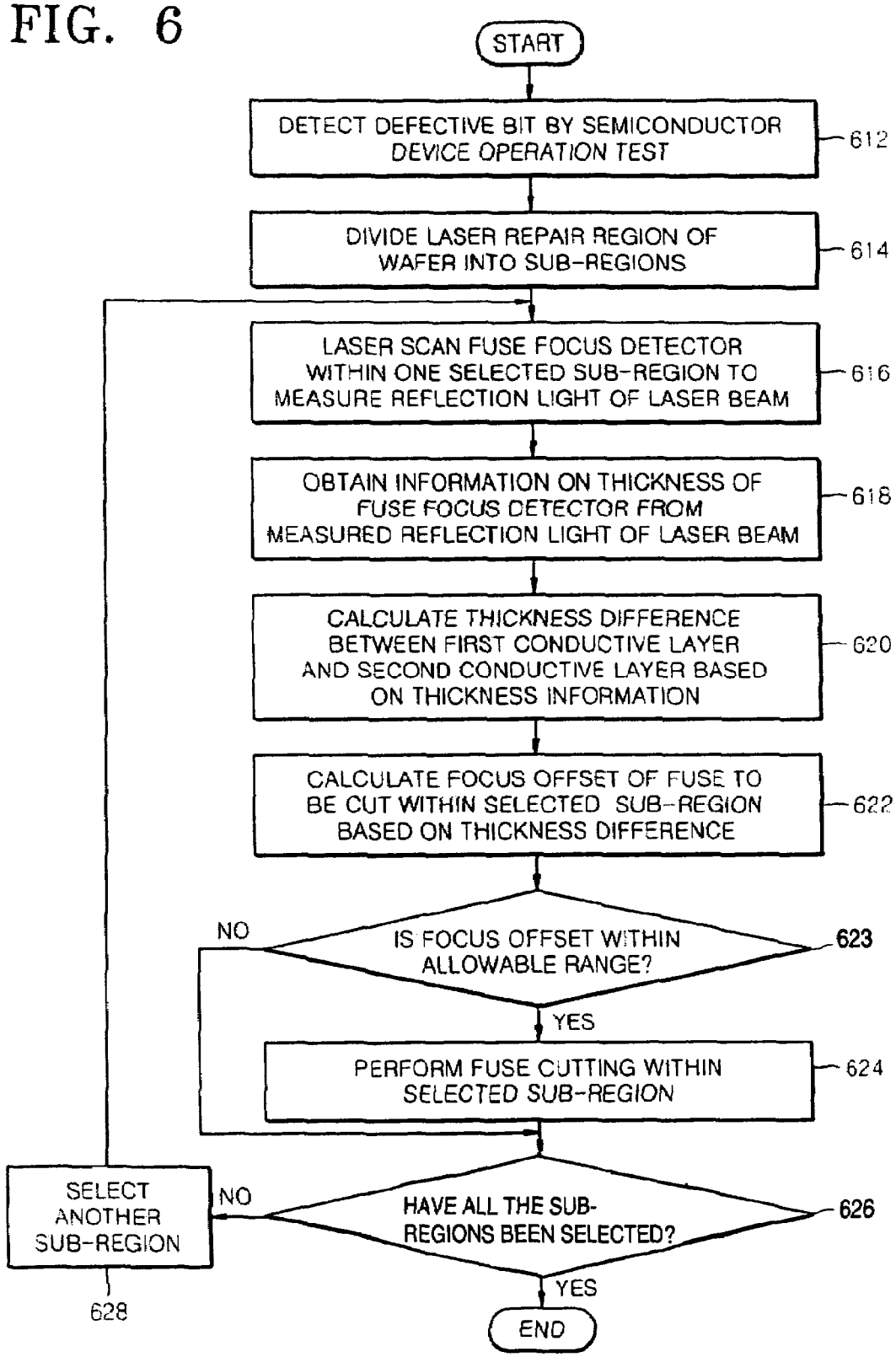
FIG. 6 is a flowchart describing a laser repair method for a semiconductor device according to an example embodiment of the present invention.

FIG. 6 is a flowchart describing a laser repair method for a semiconductor device according to an example embodiment of the present invention. The laser repair method according to an example embodiment of the present invention may utilize the fuse focus detector 32A illustrated in FIGS. 2A and 2B. However, it should be noted that the present invention is not limited to the example embodiment of a laser repair method described herein. Various fuse focus detectors that may be modified in various forms may be used without departing from the scope of the present invention.

In operation 612, a semiconductor device test may be performed on a wafer. For example, an operation test of a DRAM may be performed to detect a defective bit within normal memory cells.

In operation 614, a target region of a wafer to which a laser repair method is to be applied may be divided into a plurality of sub-regions. For example, the division of the target region may vary depending on a position of the wafer. The target region may be divided into a number of sub-regions from the center of the wafer to the edge of the wafer according to an example embodiment of the present invention. Alternatively, the target region may be divided in the unit of a shot including a number of chip regions.

In operation 616, a laser beam may scan the fuse focus detector 32A within one selected sub-region among the plurality of sub-regions and may measure reflection light of a laser beam. The laser scanning may proceed in a direction as illustrated by an arrow "S" in FIGS. 2A and 2B. Accordingly, the first conductive layer 132 and the second conductive layer 134 may be scanned concurrently during the application of the laser scanning. A laser used in the laser scanning may be a laser used for fuse cutting during a subsequent operation.

Figure 7:
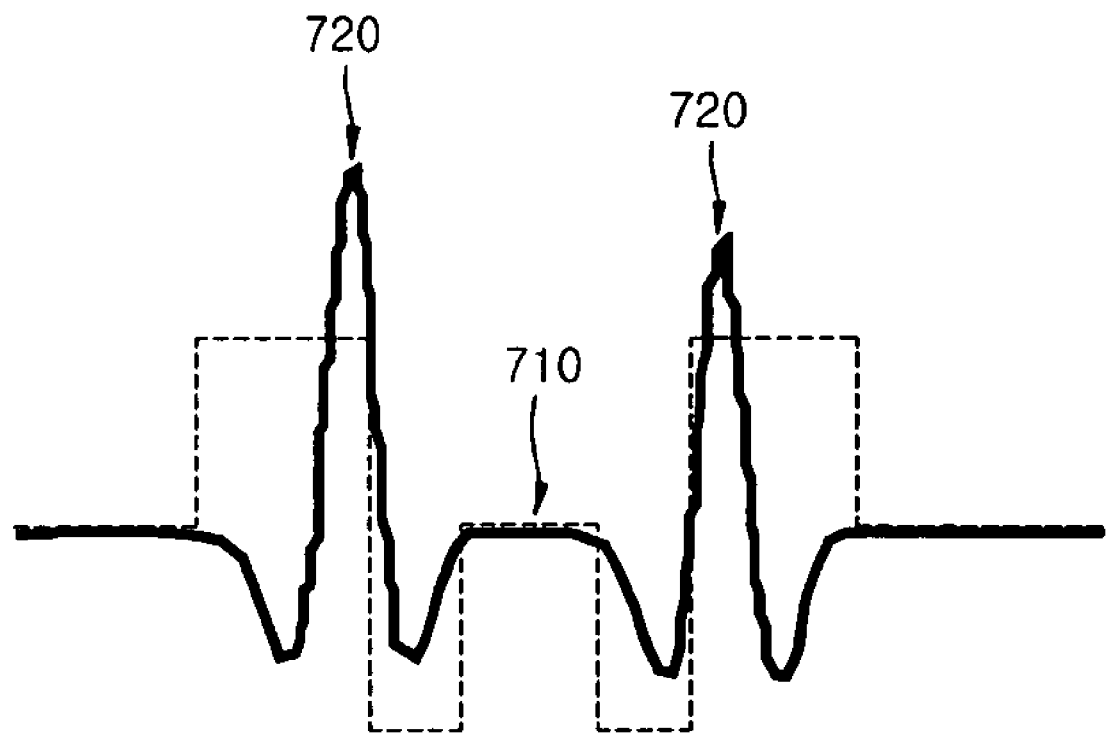
FIG. 7 is a diagram illustrating a measurement result of reflection light provided by a laser scanning operation using a fuse focus detector on the basis of a laser repair method according to an example embodiment of the present invention.

FIG. 7 illustrates a profile of an example measurement result of the reflection light obtained along the direction of the arrow "S" according to an example embodiment of the present invention. In other words, FIG. 7 illustrates the laser scanning result after the operation 616. A solid line in FIG. 7 may represent a measurement result on the reflection light obtained via an actual measurement from the fuse focus detector 32A illustrated in FIGS. 2A and 2B, whereas a dotted line in FIG. 7 may represent a theoretical change in the reflection light obtained along the direction of an arrow "S" from the fuse focus detector 32A. According to this example, a first peak 710 in FIG. 7 is data from the first conductive layer 132, while a second peak 720 is data obtained from the second conductive layer 134.

In operation 618, information on the thickness of the fuse focus detector 32A may be provided from the measurement result on the reflection light provided from the operation 616. In the example embodiment of the present invention shown in FIG. 7, the information on the thickness of the fuse focus detector 32A may be provided from a value difference between the first peak 710 and the second peak 720.

In operation 620, the thickness information provided from the operation 618 may be used to calculate a thickness difference between the first conductive layer 132 and the second conductive layer 134 both being included in the fuse focus detector 32A. In the example embodiment described in FIG. 7, data about a thickness difference between the first conductive layer 132 and the second conductive layer 134 may be obtained from the value difference between the first peak 710 and the second peak 720. Because the first conductive layer 132 and the second conductive layer 134 may be formed at different levels on the wafer, data about the thickness difference between the first conductive layer 132 and the second conductive layer 134 should exist. According to an example embodiment of the present invention, the thickness difference reflects a variation in the thickness of the first conductive layer 132, which may result from the fact that the first conductive layer 132 may be removed with a different thickness depending on a position of the first conductive layer 132 on the wafer when the insulation layer is etched to expose the fuses as illustrated and previously describe with respect to FIG. 5G.

In operation 622, a focus offset value of the fuse to be cut within the selected sub-region may be calculated based on the data about the thickness difference between the first conductive layer 132 and the second conductive layer 134 obtained from the operation 620.

In operation 624, the fuse cutting may be performed at the selected sub-region if the calculated focus offset value is within an allowable range as determined by operation 623.

In operation 628, if the calculated focus offset value is out of the allowable range, the fuse cutting may not be performed at the selected sub-region, and another sub-region may be selected.

Operations 616 through 626 may be repetitively performed until all sub-regions of the wafer have been selected, thereby completing the fuse cutting method. The repetitive nature of the method is illustrated by the determination made in operation 626.

According to example embodiments of the present invention, the fuse focus detector is not formed in the chip region but in the scribe line region and thus, additional space in the chip region may not be necessary. Further, the fuse focus detector may be formed at substantially the same time of forming the multiple interconnection lines and the fuses in the cell region. Therefore, an additional process to form the fuse focus detector may not be necessary according to an example embodiment of the present invention.

Also, according to an example embodiment of a laser repair method, prior to performing the laser repair operation, the fuse focus detector formed in the scribe line region of the wafer may be scanned by a laser beam, and an improved and/or optimum focus offset value for the fuse to be cut may be calculated based on thickness information obtained using the fuse focus detector. Therefore, even if the fuses formed at the same level on the wafer have different thickness depending on a position of the fuses on the wafer, an accurate focus offset value for the fuse to be cut may be calculated, and the fuse cutting may be performed when the calculated focus offset value is within an allowable range. Accordingly, a rate of generating defective semiconductor devices during the laser repair method may be reduced according to an example embodiment of the present invention.

While the present invention has been particularly shown and described with reference to example embodiments of the present invention, it will be understood by those of ordinary skill in the art that various changes in form and details may be made therein without departing from the spirit and scope of the present invention.

What is claimed is:

1. A semiconductor device, comprising:
   a substrate including a chip region and a scribe line region, wherein the chip region comprises a cell region, a peripheral region, and a fuse circuit unit formed in the peripheral region, and the scribe line region is formed around the chip region;
   a plurality of fuses formed at a first level with a first height from the substrate in the chip region; and
   a fuse focus detector formed on the substrate in the scribe line region and including a first conductive layer formed at the first level and a second conductive layer formed at a second level with a second height that is different from the first height;
   wherein the second conductive layer surrounds the first conductive layer when viewed from above, and
   wherein the second height is higher than the first height.

2. The semiconductor device of claim 1, wherein each of the first conductive layer and the second conductive layer is formed of a metal or a metal nitride.

3. The semiconductor device of claim 1, wherein each of the first conductive layer and the second conductive layer is formed of aluminum, copper, or an alloy of aluminum and copper.

4. The semiconductor device of claim 1, wherein the fuses and the first conductive layer of the fuse focus detector are formed of a same material.

5. The semiconductor device of claim 1, wherein the first conductive layer has a rectangular shape and the second conductive layer has a rectangular frame shape surrounding the first conductive layer when viewed from above.

6. The semiconductor device of claim 1, wherein the first conductive layer has a linear shape and the second conductive layer has a rectangular frame shape surrounding the first conductive layer when viewed from above.

7. The semiconductor device of claim 1, wherein the first conductive layer has a linear shape and the second conductive layer has a linear shape and the linear shapes are arranged in parallel when viewed from above.

8. A method of fabricating a semiconductor device, the method comprising:
   preparing a substrate including a chip region and a scribe line region, wherein the chip region comprises a cell region, a peripheral region, and a fuse circuit unit formed in the peripheral region, and the scribe line region is formed around the chip region;
   forming a plurality of fuses at a first level with a first height from a substrate in the chip region; and
   forming a fuse focus detector on the substrate in the scribe line region;
   wherein forming the fuse focus detector includes:
      forming a first conductive layer from a first conductive material at the first level; and
      forming a second conductive layer from a second conductive material adjacent to the first conductive layer at a second level with a second height from the substrate that is different from the first height;
   wherein the second conductive layer surrounds the first conductive layer when viewed from above, and
   wherein the second height is higher than the first height.

9. The method of claim 8, wherein each of the first conductive layer and the second conductive layer is formed of a metal or a metal nitride.

10. The method of claim 8, further comprising:
    forming a first insulation layer on the fuses and the first conductive layer;
    forming the second conductive material on the first insulation layer to form the second conductive layer for the fuse focus detector;
    forming a second insulation layer on the second conductive layer; and
    removing portions of the first insulation layer and the second insulation layer to expose the fuses and the first conductive layer.

11. The method of claim 8, wherein the fuses and the first conductive layer are formed simultaneously.

12. The method of claim 10, further comprising:
    forming a first interconnection line layer for constructing a structure of multiple interconnection lines in the cell region;
    wherein the first interconnection line layer is formed in the cell region simultaneously with forming the fuses and the first conductive layer.

13. The method of claim 12, further comprising:
    forming a second interconnection line layer on the first interconnection line layer to construct a structure of the multiple interconnection lines in the cell region;
    wherein the second interconnection line layer is formed simultaneously with forming the second conductive layer.

* * * * *